US010009961B2

(12) United States Patent
Ibrani

(10) Patent No.: US 10,009,961 B2
(45) Date of Patent: Jun. 26, 2018

(54) LOCAL TEMPERATURE CONTROL OF SUSCEPTOR HEATER FOR INCREASE OF TEMPERATURE UNIFORMITY

(71) Applicant: ASM IP HOLDING B.V., Almere (NL)

(72) Inventor: Sokol Ibrani, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 526 days.

(21) Appl. No.: 14/335,278

(22) Filed: Jul. 18, 2014

(65) Prior Publication Data

US 2016/0021707 A1 Jan. 21, 2016

(51) Int. Cl.

| | |
|---|---|
| ***H05B 3/68*** | (2006.01) |
| ***F27D 11/00*** | (2006.01) |
| ***H05B 3/02*** | (2006.01) |
| ***C23C 16/00*** | (2006.01) |
| ***H05B 6/10*** | (2006.01) |
| ***C23C 16/46*** | (2006.01) |
| ***H01L 21/67*** | (2006.01) |
| ***H01L 21/687*** | (2006.01) |
| ***C23C 16/458*** | (2006.01) |

(52) U.S. Cl.

CPC ......... *H05B 6/105* (2013.01); *C23C 16/4586* (2013.01); *C23C 16/46* (2013.01); *H01L 21/67103* (2013.01); *H01L 21/67109* (2013.01); *H01L 21/67248* (2013.01); *H01L 21/68792* (2013.01)

(58) Field of Classification Search

CPC ................ C23C 16/4586; C23C 16/46; H01L 21/67103; H01L 21/67109; H01L 21/67248; H01L 21/68792; H05B 6/105

USPC ...... 219/634, 385, 443.1, 444.1, 468.1, 476; 118/725, 729, 641, 715, 730

See application file for complete search history.

(56) References Cited

U.S. PATENT DOCUMENTS

| | | | | |
|---|---|---|---|---|
| 5,231,690 | A * | 7/1993 | Soma | H01L 21/67103 118/725 |
| 5,775,889 | A * | 7/1998 | Kobayashi | C23C 16/46 432/12 |
| 6,744,018 | B2 | 6/2004 | Takano | |
| 7,126,092 | B2 | 10/2006 | Lin et al. | |
| 2013/0230814 | A1 | 9/2013 | Dunn et al. | |

* cited by examiner

*Primary Examiner* — Michael G Hoang

(74) *Attorney, Agent, or Firm* — Sand & Sebolt

(57) ABSTRACT

The present disclosure relates to a substrate support and a heating assembly comprising heaters for controlling the temperature uniformity of a susceptor of the assembly and a substrate, which may be used for thin film deposition on a substrate such as semi-conductor wafer, and a method of using the same is provided for improved temperature uniformity of a susceptor and a substrate heated by the heating assembly.

20 Claims, 2 Drawing Sheets

PS
P
C1
X
A
B
C
FIG—1

LOCAL TEMPERATURE CONTROL OF SUSCEPTOR HEATER FOR INCREASE OF TEMPERATURE UNIFORMITY

BACKGROUND OF THE INVENTION

Technical Field

The present invention relates to a substrate support and heating assembly having heaters for controlling the temperature uniformity of a susceptor of the assembly and a substrate. More particularly, the assembly includes a susceptor assembly, a riser shaft and heaters suitable to effect the method.

Background Information

For many semi-conductor fabrication processes, a semiconductor substrate or wafer may be heated within a processing chamber. In some instances, the substrate or wafer is seated on a heated susceptor which is secured atop a riser shaft. A resistance heating coil or other heating mechanism is typically enclosed within the susceptor to provide conductive heat to increase the temperature of the susceptor and the semi-conductor substrate when seated thereon.

It is particularly difficult to provide a uniform temperature across the susceptor and the substrate being heated in the processing chamber, particularly with respect to the central region of the susceptor and substrate. Coil heaters which are typically embedded within the susceptor have a minimum bending radius which limits the ability to heat the central area of the susceptor and the substrate. In addition, the riser shaft typically serves as a heat sink which draws heat from the central region of the susceptor and substrate. While some prior inventions such as those disclosed in U.S. Pat. No. 6,744,018 and U.S. Pat. No. 7,126,092 have addressed the control of heating in a similar context, it has been found that there is still a need for the ability to control the uniformity of the temperature of the susceptor and substrate within tighter tolerances in order to provide for the exacting requirements needed for high quality production of semiconductor components.

SUMMARY

In one aspect, the invention may provide an apparatus comprising a substrate support assembly comprising a riser shaft having a first end and a susceptor assembly which is secured to the riser shaft adjacent the first end and which has a substrate support surface; a first heater carried by the susceptor assembly; and a second heater which extends downwardly adjacent the first end of the riser shaft.

In another aspect, the invention may provide an apparatus comprising a substrate support assembly comprising a riser shaft having a first end and a susceptor assembly which is secured to the riser shaft adjacent the first end and which has a substrate support surface and a central region; a first heater carried by the susceptor assembly; and a second heater which extends downwardly adjacent the central region.

In another aspect, the invention may provide an apparatus comprising a substrate support assembly comprising a riser shaft having a first end and a susceptor assembly which is secured to the riser shaft adjacent the first end and which has a substrate support surface; a planar first heater which essentially lies entirely along a plane and extends along the susceptor assembly; and a second heater which extends from adjacent the plane in a direction away from the plane.

In another aspect, the invention may provide a method comprising the steps of providing a substrate support assembly comprising a riser shaft having a first end and a susceptor assembly which is secured to the riser shaft adjacent the first end and which has a substrate support surface; heating the susceptor with a first heater; heating a region of the substrate support assembly adjacent the first end of the riser shaft with a second heater which extends downwardly adjacent the first end of the riser shaft; positioning a substrate on the substrate support surface; and transferring heat from the susceptor to the substrate.

BRIEF DESCRIPTION OF THE SEVERAL VIEWS OF THE DRAWINGS

A sample embodiment of the invention is set forth in the following description, is shown in the drawings and is particularly and distinctly pointed out and set forth in the appended claims.

DETAILED DESCRIPTION

Figure 1:
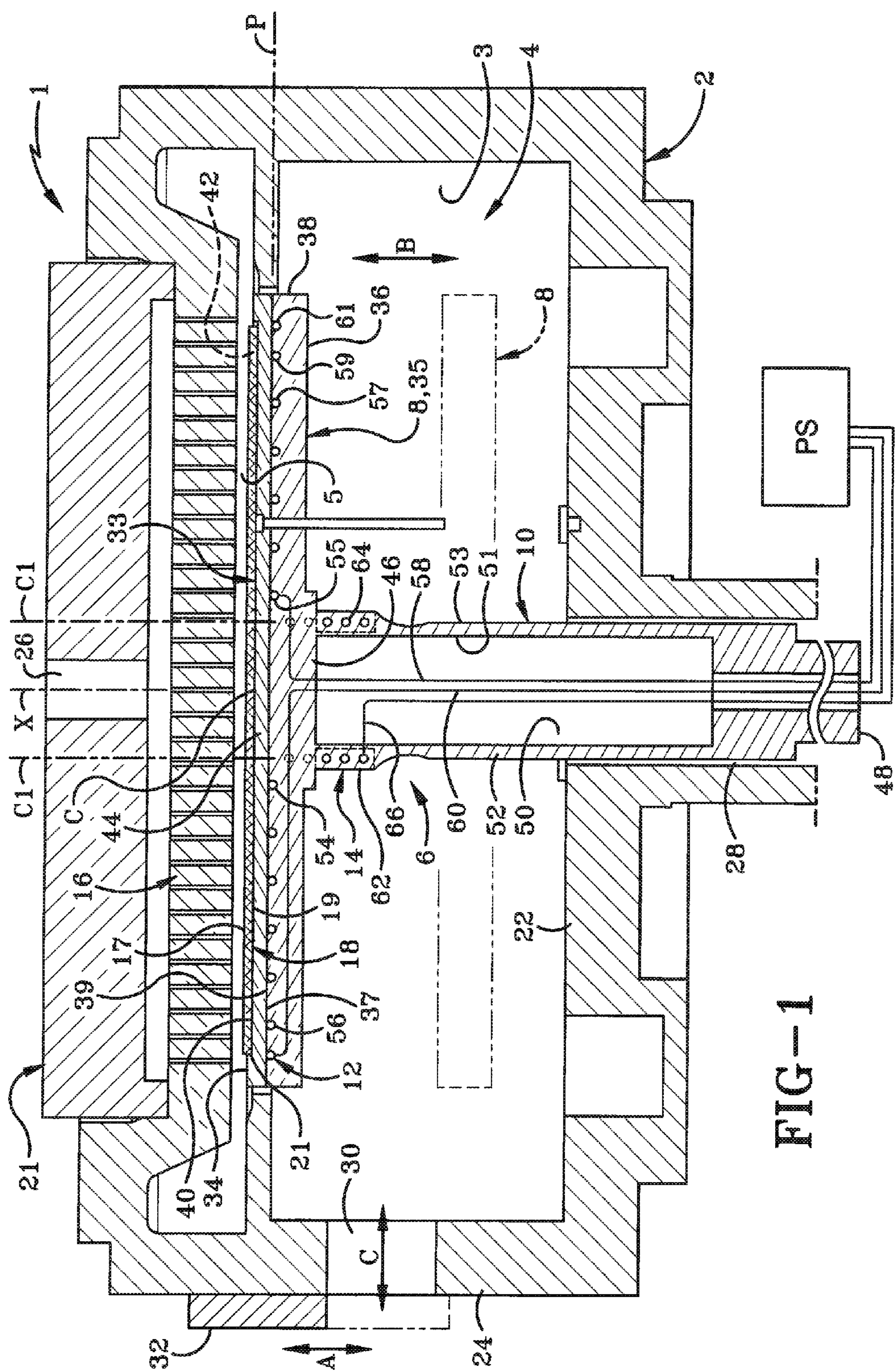
FIG. 1 is a sectional view taken from the side of a sample embodiment of a reactor system using the susceptor heater assembly.

FIG. 1 shows a reactor system 1 which includes a processing chamber or reaction chamber 2 defining an interior chamber 4 in which is disposed a substrate support and heating assembly 6 which comprises a susceptor assembly 8 and a riser shaft 10. Chamber 4 includes a loading region 3 and a processing region 5 directly above and in communication with region 3. Assembly 6 may also be referred to as a substrate support assembly, a substrate heating assembly, a support assembly, a heating assembly or the like. Assembly 6 includes heaters 12 and 14 which are disposed in chamber 4 for providing heat to susceptor assembly 8 and riser shaft 10. Either of heaters 12 and 14 may be referred to as a first heater or a second heater. Heater 12 may be also be referred to as a susceptor heater 12 while heater 14 may be referred to as a riser shaft heater 14 although heat provided by heaters 12 and 14 will tend to overlap such that each of heaters 12 and 14 may provide heat to susceptor assembly 8 and riser shaft 10. A thin film deposition showerhead 16 may also be disposed in chamber 4 for depositing films such as one atomic layer at a time on a substrate or wafer 18 which may be a semi-conductor substrate or wafer. Substrate 18 is typically thin and flat and may be disc shaped. Substrate 18 may have a flat circular top surface 17, a flat circular bottom surface 19 and a circular outer perimeter 21 extending from top surface 17 to bottom surface 19.

Reaction chamber 2 may include a top wall 20, a bottom wall 22, and a side wall 24. Although the shape may vary, top and bottom walls 20 and 22 are typically, generally flat walls which are generally circular as viewed from above. Similarly, although the shape of sidewall 24 may vary, it is typically generally cylindrical. A gas supply port 26 is provided on top wall 20 in fluid communication with chamber 4 and an external gas supply to provide a desired gas from outside chamber 2 into interior chamber 4. A riser shaft receiving passage 28 is defined in bottom wall 22 for receiving therein riser shaft 10. A substrate or wafer insertion and removal port 30 is defined in sidewall 24 to allow for the insertion therethrough of substrate 18 into loading region 3 of chamber 4 and removal of substrate 18 from loading region 3 when a valve or door 32 is in the open position as shown in solid lines in FIG. 1. Valve or door 32 is movable (Arrow A) between the open position and a closed position shown in dashed lines. Valve 32 in the closed position seals chamber 4 to prevent gas from moving into or exiting chamber 4 through port 30.

Susceptor assembly 8 is typically a flat, horizontal plate and usually has a disc shaped configuration. Susceptor assembly 8 may include a susceptor 33 and a support plate or heater plate 35 which may be rigidly secured to susceptor 33 with susceptor 33 atop plate 35. Each of susceptor 8 and plate 35 is typically a flat, horizontal plate and usually has a disc shaped configuration. Susceptor assembly 8 may have a circular upwardly facing top surface 34 which also serves as a top surface of susceptor 33, a circular downwardly facing bottom surface 36 which also serves as a bottom surface of plate 35, and an outer perimeter 38 or diameter which extends from top surface 34 to bottom surface 36 and may also serve respectively as outer perimeters of susceptor 33 and plate 35. Outer perimeter 38 is typically circular or cylindrical. Susceptor 33 may have a circular downwardly facing bottom surface 37, and plate 35 may have a circular upwardly facing top surface 39 which abuts and is rigidly secured to bottom surface 37. Susceptor assembly 8/susceptor 33 has an upwardly facing flat horizontal substrate support surface 40 which in the sample embodiment is recessed downwardly a small distance from top surface 34. Susceptor assembly 8/susceptor 33 may define a substrate receiving space 42 which extends upwardly from support surface 40 a short distance and has the shape and dimensions of substrate or wafer 18, whereby top surface 17, bottom surface 19 and outer perimeter 21 may also respectively represent the top, bottom and outer perimeter of space 42. Susceptor assembly 8 has a central region 44 which extends radially outwardly from a center C of susceptor assembly 8 which lies on a typically vertical longitudinal axis X about which support assembly 6 is rotatable. Susceptor 33 and plate 35 may be formed of metal, graphite or another suitable material.

Riser shaft 10 has a first or top end 46 and an opposed second or bottom end 48. Riser shaft 10 is typically vertically elongated and defines a vertical or vertically elongated passage 50 which extends from first end 46 to second end 48 and through which axis X passes. More particularly, riser shaft 10 has a sidewall 52 having an inner perimeter or surface 51 which faces and defines passage 50, and an outer perimeter or surface 53 which faces away from passage 50. Surfaces 51 and 53 extend from first end 46 to second end 48. First end 46 is in interior chamber 4 while the second end 48 is outside chamber 4. Susceptor assembly 8 is secured to riser shaft 10 adjacent top end 46 and extends radially outwardly therefrom. Outer perimeter or diameter 38 of susceptor assembly 8 is substantially larger than outer perimeter or diameter 53 of shaft 10. Riser shaft 10/sidewall 52 may be formed of metal, graphite or another suitable material.

Susceptor heater 12 has a first or inner heating element shown here as a heating coil 54 and a second or outer heating element shown here as a heating coil 56. Heating elements 54 and 56 may extend along and be carried by susceptor assembly 8. Heating elements 54 and 56 may be embedded in susceptor assembly 8, such as along the interface between susceptor 33 and plate 35 adjacent bottom surface 37 and top surface 39. Although shown here as heating coils, other configurations are contemplated. Wires 58 are connected to first coil 54 and a power source and controller PS to provide electrical communication between coil 54 and power source/controller PS. Wires 60 are likewise connected to second coil 56 and power supply and control PS to provide electrical communication between coil 54 and power source/controller PS. The power supply for the coils may be different and each of the coils may be independently controlled. Susceptor heater 12 may be a planar heater which essentially lies entirely along a horizontal plane P which may pass through susceptor assembly 8. Each of coils 54 and 56 may have a spiral shape which spirals outwardly away from axis X such that each coil may be a planar heating coil which essentially lies entirely along horizontal plane P. Inner coil 54 has an inner radius or perimeter 55 and an outer radius or perimeter 57. Outer coil 56 has an inner radius or perimeter 59 and an outer radius or perimeter 61. Perimeters 55, 57, 59 and 61 may be essentially circular as viewed from above. Outer perimeter 61 of outer coil 56 is typically adjacent and radially inward of outer perimeter 38 of susceptor assembly 8. Outer perimeter 57 of inner coil 54 is typically adjacent and radially inward of inner perimeter 59 of outer coil 56. Inner perimeter 55 of inner coil 54 is typically adjacent central region 44 and may serve as an outer boundary or perimeter of central region 44.

Heater 14 may include a ring or annular collar 62 which is separate from side wall 52, as illustrated by the dashed lines in FIG. 1. Collar 62 may be cylindrical in shape and may be formed of metal, graphite or another suitable material. Collar 62 may, for example, be welded, brazed or press fit on to sidewall 52. When used, collar 62 circumscribes sidewall 52. Heater 14 includes a heating element shown here as a heating coil 64 which is in electrical communication, like the other heating elements, with power source PS. In particular, wires 66 are connected to coil 64 and power source or control PS. Wires 58, 60 and 66 extend into passage 50 in order to connect to the respective coil. Heating element 64 may extend downwardly adjacent upper end 46 of riser shaft 46 and central region 44 and may extend downwardly from adjacent the outer perimeter of central region 44 and inner perimeter 55 of inner coil 54. Heating element 64 may extend downwardly along riser shaft 10 adjacent upper end 46. Heating element 64 may be entirely radially inward of inner perimeter 55 of coil 54/the outer perimeter of central region 44, or put another way, may be closer in its entirety to axis X than is inner perimeter 55/the outer perimeter of central region 44.

FIG. 1 uses solid lines and dashed lines related to coil 64. Coil 64 may include both the solid and dashed lines, or only the solid lines, or only the dashed lines. Coil 64 may be embedded in collar 62 where a collar is used, or may be embedded in a portion of sidewall 52 adjacent top end 46. In either case, coil 64 is radially outward of and may circumscribe or surround a portion of inner surface 51 adjacent end 46, a portion of passage 50 adjacent end 46, and a portion of sidewall 52 adjacent end 46. Where coil 64 is embedded in collar 62, coil 64 is radially outward of and may circumscribe sidewall 52 including its outer surface 53. Coil 64 may also be embedded partially or entirely in plate 35, as shown in dashed lines, or coil 64 may be embedded partially or entirely in riser shaft 10/sidewall 52, as shown in solid lines. Coil 64 may be a vertically elongated heating coil and may be concentric about axis X. Coil 64 may have a helical shape although other shapes are contemplated. Coil 64 may be a non-planar heater or heating coil which, unlike coils 54 and 56, does not essentially lie entirely along a plane. However, heating element 64 may include one or more coils or other heating elements which may be planar such that they essentially lie entirely along a plane which not parallel to plane P, but rather at an angle to plane P. Coil 64 may essentially lie entirely along a cylinder C1, which may be concentric about axis X or along a cone, which may also be concentric about axis X. Coil 64 may extend from adjacent plane P in which planar coils 54 and 56 lie in a direction (here downwardly) away from plane P. In the sample embodiment, coil 64 lies along cylinder C1 which is perpendicular to plane P. Heating element 64 may be entirely on one side (here below) plane P.

In operation, coils 54, 56 and 64 are heated and controlled independently or together by controller PS as desired to provide heat to substrate or wafer 18 by conduction. Coils 54 and 56 primarily provide resistance heat which is transferred by conduction to susceptor assembly 8 (susceptor 33 and plate 35). Coil 64 likewise primarily provides resistance heat which is conducted to collar 62 (where used) and sidewall 52 adjacent collar 62, or to the portion of sidewall 52 of shaft 10 in which coil 64 may be embedded, and/or to the central portion of plate 35 in which coil 64 may be embedded, whereby some of this heat is also transferred into central region 44 of susceptor assembly 8 and the central portion of substrate 18. Heat from susceptor 33, which originated from coils 54, 56, and 64, is in turn transferred by conduction to substrate 18.

Figure 2:
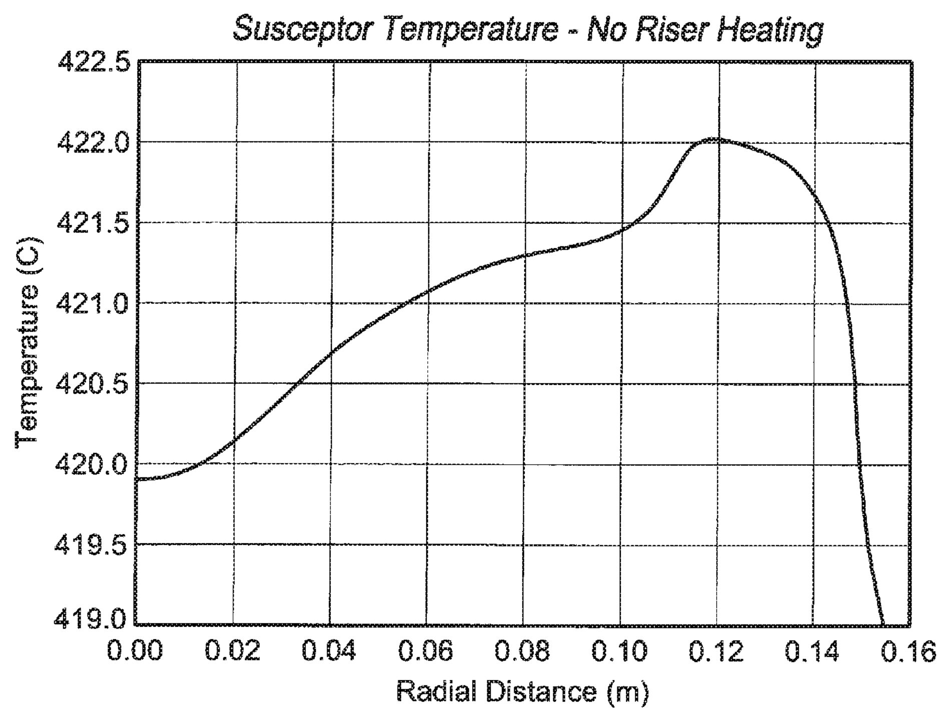
FIG. 2 is a graph showing the susceptor temperature at various radial distances from the center of the susceptor when the riser shaft heater is not heating.
Figure 3:
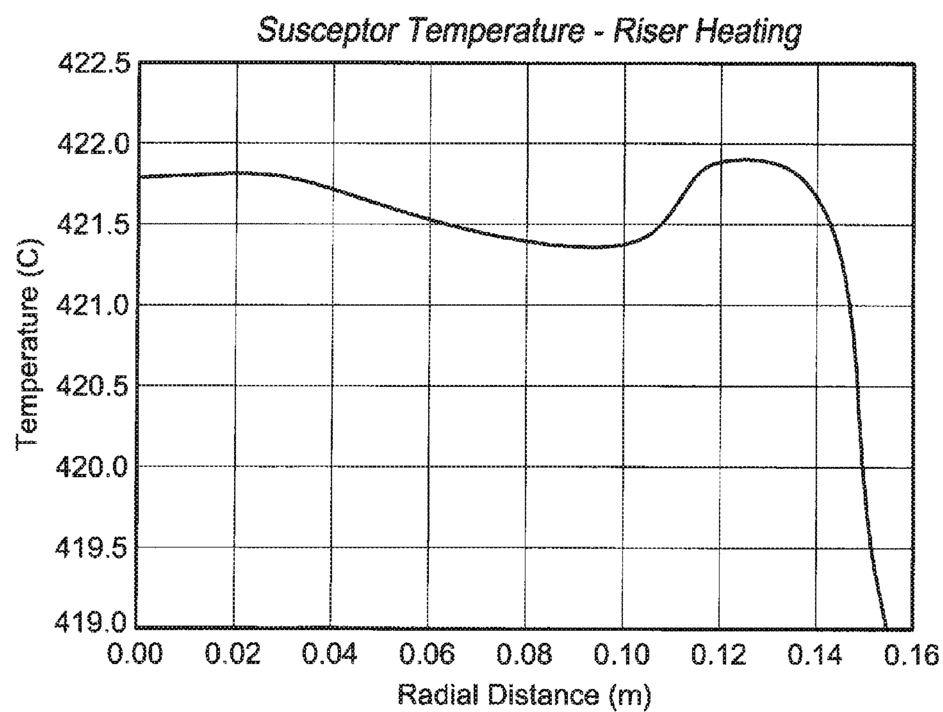
FIG. 3 is similar to FIG. 2 and shows the susceptor temperature when the riser shaft heater is heating.

The use of susceptor heater 12 and riser shaft heater 14 allows for a substantially tighter control of the heating process as illustrated by FIGS. 2 and 3, which are graphs related to the heating of a 300-millimeter diameter susceptor. FIG. 2 illustrates the heating of the susceptor without riser shaft heating. That is, FIG. 2 illustrates the temperature of susceptor assembly 8/susceptor 33 at various radial distances from center C when controller PS is controlling the heating such that coils 54 and 56 of heater 12 are turned on to provide heating of susceptor assembly 8 and coil 64 of heater 14 is not turned on (is in an off position) so that coil 64 does not provide any heating of susceptor assembly 8. On the other hand, FIG. 3 illustrates the heating of the susceptor assembly with riser shaft heating, and thus shows the temperature of susceptor assembly 8/susceptor 33 at various radial distances from center C when controller PS is controlling the heating such that all of coils 54, 56 and 64 are turned on to provide heating of susceptor assembly 8 and riser shaft 10 adjacent upper end 46. As can be seen from FIG. 2, providing heat to the susceptor only via coils 54 and 56 provides a temperature tolerance across susceptor assembly 8 which is more than 2.0° C. More particularly, this temperature tolerance or variation relates to the temperature of the susceptor along substrate support surface 40 along the horizontal area or space 42, that is, within outer perimeter 21 of space 42, or from center C radially outward to outer perimeter 21. On the other hand, FIG. 3 illustrates that the corresponding temperature tolerance or variation across susceptor assembly 8 may be no more than 1.0° C. and even no more than 0.5° C. Thus, for instance, susceptor heater assembly 6 is capable of maintaining a temperature tolerance or variation of susceptor assembly 8 over the entire support surface 40 which defines space 42 within no more than 0.5, 0.6, 0.7, 0.8, 0.9 or 1.0° C. while, for instance, heating the susceptor to a temperature within a range of about 400 to 450° C. This temperature tolerance may also be maintained while heating susceptor assembly 8 and substrate 18 to temperatures in different ranges, for instance, within a temperature range of about 200 to 1000, 1500, 2000, 2500 or 3000° C. or more. Likewise, the heater assembly is capable of keeping the temperature of substrate or wafer 18 throughout its entirety within the same tolerance at such temperature ranges.

As known in the art, susceptor assembly 8 and riser shaft 10 are movable up and down (which may be linear vertical movement parallel to axis X) as illustrated at Arrow B between a raised or processing position shown in solid lines and a lowered or loading position shown in dashed lines. This allows for the raising and lowering of substrate 18 and the insertion and removal of substrate 18 as illustrated at Arrow C when valve 32 is in the open position. Thus, riser shaft 10 and susceptor assembly 8 are moved to the lowered position so that susceptor assembly 8 is in loading region 3 and wafer 18 is inserted through opening 30 when valve 32 is open in order to place wafer 18 on top of susceptor assembly 8 atop support surface 40 within space 42. Valve 32 may then be shut and susceptor assembly 8 and shaft 10 lifted back to the raised position with substrate 18 on surface 40 for processing in region 5. The heater assembly 6 is controlled by controller PS to control the heating of susceptor assembly 8 and substrate 18 as noted above within the various tight tolerances. With the susceptor and the substrate in the raised position and while susceptor assembly 6 is operated to maintain the temperature within a tight tolerance such as noted above (and typically while heater assembly 6 rotates about axis X), thin film deposition may take place via insertion of a suitable gas (or gases) via port 26 and showerhead 16 in order to deposit a thin film on top of substrate 18 one atomic layer at a time, as generally known in the art other than the ability to control the susceptor and substrate temperature tolerance as noted. The gas is heated prior to entering chamber 4 to a temperature as close as possible to the desired processing temperature of susceptor assembly 8 and substrate 18 to help maintain the substantial uniformity of temperature throughout substrate 18 during processing. Although reactor system 1 is shown using thin film deposition showerhead 16 to this purpose, the heater assembly of the present invention may be used with other reactors, such as that of a cross-flow reactor system, which may also be represented by system 1. One example of such a cross-flow reactor system is the Pulsar® reaction chamber manufactured by ASM America, Inc.

The present heating system thus provides the ability to more tightly control temperature variation within a susceptor and substrate and is particularly helpful for controlling the temperature delta at the wafer center. This ability allows for substantial reduction of the reject rate of processed substrates.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of the preferred embodiment of the invention are an example and the invention is not limited to the exact details shown or described.

The invention claimed is:

1. An apparatus comprising:

a substrate support assembly comprising a riser shaft centered along an axis having a first end and a susceptor assembly which is secured to the riser shaft adjacent the first end and which has a substrate support surface;

a first resistive heating element carried by the susceptor assembly;

a second resistive heating element which extends circumferentially around the axis and downwardly from adjacent the first end of the riser shaft;

wherein the second resistive heating element is a vertically elongated resistive coil which has a helical shape;

wherein the riser shaft comprises a sidewall having an inner surface defining a riser shaft passage; and the second resistive heating element is disposed radially outward of the inner surface extending downwardly along and adjacent to the riser shaft passage; and wherein the second resistive heating element is entirely radially inward of the first resistive heating element.

2. The apparatus of claim 1 wherein the substrate support assembly is rotatable about the axis; and the second resistive heating element is concentric about the axis, and the first resistive heating element is concentric about the axis.

3. The apparatus of claim 1 wherein the substrate support assembly is rotatable about the axis; and the resistive coil is concentric about the axis.

4. The apparatus of claim 1 wherein the first resistive heating element essentially lies entirely along a horizontal plane.

5. The apparatus of claim 4 wherein the first resistive heating element is a first heating coil which has a spiral shape.

6. The apparatus of claim 1 wherein the second resistive heating element circumscribes the inner surface.

7. The apparatus of claim 1 wherein the second resistive heating element is embedded in the sidewall.

8. The apparatus of claim 1 further comprising a wire within the passage connected to the first resistive heating element or the second resistive heating element.

9. The apparatus of claim 8 further comprising a power source connected to the wire.

10. The apparatus of claim 1 wherein the second resistive heating element circumscribes the riser shaft adjacent the first end of the riser shaft.

11. The apparatus of claim 10 further comprising a collar which circumscribes the riser shaft adjacent the first end of the riser shaft; wherein the second resistive heating element is embedded in the collar.

12. The apparatus of claim 1 further comprising an interior chamber; wherein a susceptor is in the interior chamber.

13. The apparatus of claim 12 wherein the second resistive heating element is in the interior chamber.

14. The apparatus of claim 12 further comprising a showerhead in the interior chamber.

15. The apparatus of claim 12 further comprising a gas supply port in fluid communication with the interior chamber.

16. The apparatus of claim 1 further comprising a showerhead adjacent a susceptor.

17. The apparatus of 1 wherein the first resistive heating element is a planar heater which essentially lies entirely along a plane; and the second resistive heating element extends from adjacent the plane in a direction away from the plane.

18. An apparatus comprising:

a substrate support assembly comprising a riser shaft having a first end and a susceptor assembly which is secured to the riser shaft adjacent the first end and which has a substrate support surface and a central region;

a first resistive heating element carried by the susceptor assembly;

a second resistive heating element comprising a vertically elongated resistive coil which has a helical shape and which extends circumferentially around and downwardly from adjacent the central region, wherein the riser shaft comprises a sidewall having an inner surface which defines a riser shaft passage, and the second resistive heating element is disposed radially outward of the inner surface extending downwardly along and adjacent to the riser shaft passage; and wherein the second resistive heating element is entirely radially inward of the first resistive heating element.

19. An apparatus comprising:

a substrate support assembly comprising a riser shaft having a first end and a susceptor assembly which is secured to the riser shaft adjacent the first end and which has a substrate support surface;

a planar first resistive heating element which essentially lies entirely along a plane and extends along the susceptor assembly;

a second resistive heating element comprising a vertically elongated resistive coil which has a helical shape and which extends from adjacent the plane in a direction away from the plane, wherein the riser shaft defines a hollow passage, and the second resistive heating element is disposed radially outward of the hollow passage and extends downwardly along and adjacent to the hollow passage; and wherein the second resistive heating element is entirely radially inward of the first resistive heating element.

20. A method comprising the steps of:

providing a substrate support assembly comprising a riser shaft having a first end and a susceptor assembly which is secured to the riser shaft adjacent the first end and which has a substrate support surface;

heating the susceptor assembly with a first resistive heating element;

heating a region of the substrate support assembly adjacent the first end of the riser shaft with a second resistive heating element which extends circumferentially around and downwardly from adjacent the first end of the riser shaft;

positioning a substrate on the substrate support surface;

transferring heat from the susceptor assembly to the substrate;

wherein the second resistive heating element is a vertically elongated resistive coil which has a helical shape; and wherein the riser shaft comprises a sidewall having an inner surface defining a riser shaft passage; and the second resistive heating element is disposed radially outward of the inner surface extending downwardly along and adjacent to the riser shaft passage; and wherein the second resistive heating element is entirely radially inward of the first resistive heating element.

* * * * *